United States Patent
Cha et al.

(10) Patent No.: US 11,081,455 B2
(45) Date of Patent: Aug. 3, 2021

(54) SEMICONDUCTOR DEVICE WITH BOND PAD EXTENSIONS FORMED ON MOLDED APPENDAGE

(71) Applicant: Infineon Technologies Austria AG, Villach (AT)

(72) Inventors: Chan Lam Cha, Melaka (MY); Wei Han Koo, Melaka (MY); Thorsten Meyer, Regensburg (DE); Klaus Schiess, Allensbach (DE); Guan Choon Matthew Nelson Tee, Malacca (MY)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/397,219

(22) Filed: Apr. 29, 2019

(65) Prior Publication Data
US 2020/0343205 A1  Oct. 29, 2020

(51) Int. Cl.
  *H01L 23/495* (2006.01)
  *H01L 23/00* (2006.01)
  *H01L 21/56* (2006.01)

(52) U.S. Cl.
  CPC .............. *H01L 24/05* (2013.01); *H01L 21/56* (2013.01); *H01L 24/03* (2013.01); *H01L 24/06* (2013.01); *H01L 24/48* (2013.01); *H01L 24/49* (2013.01); *H01L 2224/0346* (2013.01); *H01L 2224/04042* (2013.01); *H01L 2224/04105* (2013.01); *H01L 2224/05552* (2013.01); *H01L 2224/05573* (2013.01); *H01L 2224/0616* (2013.01); *H01L 2224/48175* (2013.01);
  (Continued)

(58) Field of Classification Search
  CPC ......... H01L 24/05; H01L 24/49; H01L 24/48; H01L 21/56; H01L 24/06; H01L 24/03; H01L 2224/05552; H01L 2224/49111; H01L 2224/04042; H01L 2224/05573; H01L 2224/0616; H01L 2224/48175; H01L 2224/49112; H01L 2224/0346; H01L 2224/04105; H01L 2224/48227
  See application file for complete search history.

(56) References Cited

U.S. PATENT DOCUMENTS

| 8,786,111 | B2 | 7/2014 | Fuergut et al. |
| 9,455,157 | B1 * | 9/2016 | Jain ........................ H01L 23/66 |

(Continued)

*Primary Examiner* — Ismail A Muse
(74) *Attorney, Agent, or Firm* — Murphy, Bilak & Homiller, PLLC (57) ABSTRACT

A semiconductor device includes a semiconductor die having a main surface, a rear surface, outer edge sides extending between the main and rear surfaces, and a first conductive bond pad disposed on the main surface, an electrically insulating mold compound body formed around the outer edge sides of the semiconductor die with the main surface of the semiconductor die exposed from an upper surface of the mold compound body, a first metallization layer formed on the upper surface of the mold compound body and on the main surface of the semiconductor die, and a first bond pad extension formed in the first metallization layer. The first bond pad extension overlaps with the upper surface of the mold compound body. The first bond pad extension is conductively connected with the first conductive bond pad. The first bond pad extension is an externally accessible point of electrical contact of the device.

14 Claims, 8 Drawing Sheets

(52) U.S. Cl.
CPC .............. *H01L 2224/48227* (2013.01); *H01L 2224/49111* (2013.01); *H01L 2224/49112* (2013.01)

(56) References Cited

U.S. PATENT DOCUMENTS

| | | | | |
|---|---|---|---|---|
| 2006/0286711 | A1* | 12/2006 | Mangold | H01L 24/49 438/106 |
| 2007/0257340 | A1* | 11/2007 | Briggs | H01L 24/49 257/666 |
| 2009/0008756 | A1* | 1/2009 | Lim | H01L 23/49506 257/676 |
| 2009/0020857 | A1* | 1/2009 | Cusack | H01L 23/50 257/666 |
| 2009/0273074 | A1* | 11/2009 | Li | H01L 24/49 257/692 |
| 2010/0252918 | A1* | 10/2010 | Jiang | H01L 23/49551 257/675 |
| 2012/0248539 | A1* | 10/2012 | Zhang | H01L 25/074 257/368 |
| 2013/0009294 | A1* | 1/2013 | Chen | H01L 23/49513 257/670 |
| 2013/0154071 | A1* | 6/2013 | Haigh | H01L 23/49503 257/676 |
| 2017/0221857 | A1 | 8/2017 | Mahler et al. | |
| 2017/0287816 | A1* | 10/2017 | Vreman | H01L 23/49548 |
| 2017/0373024 | A1* | 12/2017 | Graf | H01L 24/06 |
| 2018/0108598 | A1* | 4/2018 | Niu | H05K 3/32 |
| 2018/0158770 | A1* | 6/2018 | Lin | H01L 25/105 |
| 2019/0006199 | A1* | 1/2019 | Tsou | H01L 21/486 |
| 2019/0051585 | A1* | 2/2019 | Dimaano, Jr. | H01L 23/3121 |
| 2020/0135790 | A1* | 4/2020 | Kim | H01L 23/345 |

\* cited by examiner

SEMICONDUCTOR DEVICE WITH BOND PAD EXTENSIONS FORMED ON MOLDED APPENDAGE

The present invention generally relates to semiconductor devices and more particularly relates to techniques for electrically contacting power semiconductor devices.

BACKGROUND

Power electronics applications utilize semiconductor switching devices that are rated to switch large currents and/or voltages, e.g., 1 ampere or more and/or 200 volts or more. Semiconductor switching devices that include III-V semiconductor materials such as gallium nitride (GaN), gallium arsenide (GaAs), indium arsenide (InAs), etc. are popular due to advantageous power switching performance. However, one drawback of III-V semiconductor material is an increased cost in comparison to more commonplace semiconductor material such as silicon. For this reason, designers seek to reduce the die size of III-V semiconductor power switching devices without sacrificing performance.

Current techniques for forming electrical connections with semiconductor dies place constraints on how much the die size can be reduced without sacrificing performance. For example, bond wires that are used to contact the bond pads of semiconductor dies can only handle a limited amount of current. Thus, in the case of power applications, the bond pad area of the semiconductor die must be maintained sufficiently large to accommodate multiple bond wires, which limits the scalability of the die. Alternatively, metal clips generally provide enhanced current carrying capability in comparison to bond wires. However, metal clips add cost and complexity to the design, and are particularly difficult to configure with small die sizes.

SUMMARY

A semiconductor device is disclosed. According to an embodiment, the semiconductor device comprises a semiconductor die comprising a main surface, a rear surface, outer edge sides extending between the main and rear surfaces, and a first conductive bond pad disposed on the main surface, an electrically insulating mold compound body that is formed around the outer edge sides of the semiconductor die such that the main surface of the semiconductor die is exposed from an upper surface of the mold compound body, a first metallization layer formed on the upper surface of the mold compound body and on the main surface of the semiconductor die, and a first bond pad extension formed in the first metallization layer. The first bond pad extension overlaps with the upper surface of the mold compound body. The first bond pad extension is conductively connected with the first conductive bond pad. The first bond pad extension is an externally accessible point of electrical contact of the semiconductor device.

Separately or in combination, the first metallization layer is structured to include a first continuous region of the first metallization layer that overlaps with the semiconductor die and the mold compound body, the first continuous region forms the first bond pad extension and a first bond pad connector that at least partially overlaps with the first conductive bond pad and is in direct electrical contact with the first conductive bond pad.

Separately or in combination, the mold compound body is formed to include a first appendage that adjoins a first one of the outer edge sides of the semiconductor die and laterally extends away from the first outer edge side, and the first bond pad connector laterally extends over the first outer edge side of the semiconductor die and merges with the first bond pad extension.

Separately or in combination, the upper surface of the mold compound body in the first appendage is substantially coplanar with the main surface of the semiconductor die.

Separately or in combination, the first conductive bond pad and the first bond pad extension are elongated, and a length of the first bond pad extension is greater than a length of the first conductive bond pad.

Separately or in combination, an area of the first bond pad extension is greater than an area of the first bond pad.

Separately or in combination, the semiconductor die further comprises a second conductive bond pad disposed on the main surface and physically separated from the first bond pad, the first metallization layer is structured such that the first continuous region further comprises a second bond pad connector that at least partially overlaps with and is in direct electrical contact with the second conductive bond pad, and the second bond pad connector is conductively connected with the first bond pad extension.

Separately or in combination, the semiconductor die further comprises a third conductive bond pad disposed on the main surface in between the first and second conductive bond pads, the semiconductor device further comprises a second bond pad extension formed in the first metallization layer, the second bond pad extension overlaps with the upper surface of the mold compound body, the second bond pad extension is conductively connected with the third conductive bond pad, and the second bond pad extension is an externally accessible point of electrical contact of the semiconductor device.

Separately or in combination, the mold compound body is formed to include a second appendage that is opposite from the first outer edge side, wherein the second appendage laterally extends away from the second edge side, wherein the first metallization layer is structured to include a second continuous region of the first metallization layer that overlaps with the semiconductor die and the mold compound body, wherein the second continuous region forms the second bond pad extension and a third bond pad connector that at least partially overlaps with and is in direct electrical contact with the third conductive bond pad.

Separately or in combination, the first, second, and third conductive bond pads are each elongated in a first direction that is perpendicular to the first outer edge side, and wherein the first and second bond pad extensions are each elongated in a second direction that is perpendicular to the first direction.

An assembly is disclosed. According to an embodiment, the assembly comprises a semiconductor device, comprising a semiconductor die comprising a main surface, a rear surface, outer edge sides extending between the main and rear surfaces, and a first conductive bond pad disposed on the main surface, an electrically insulating mold compound body that is formed around the outer edge sides of the semiconductor die such that the main surface of the semiconductor die is exposed from an upper surface of the mold compound body, a first metallization layer formed on the upper surface of the mold compound body and on the main surface of the semiconductor die, and a first bond pad extension that is formed in the first metallization layer and is conductively connected with the first conductive bond pad. The assembly further comprises an electrical contact point external to the semiconductor device, and an attachable electrical connector forming a conductive connection between the first bond pad extension and the electrical contact point.

Separately or in combination, the assembly further comprises an electrically conductive lead frame that comprises a die paddle and a plurality of electrically conductive leads extending away from the die paddle, the semiconductor device is mounted on the die paddle, and the electrical contact point is one of the leads.

Separately or in combination, the assembly further comprises a circuit board that comprises a second electrical component mounted thereon and a plurality of conductive tracks, the semiconductor device is mounted on the circuit board, and the electrical contact point is a bond pad connection to one of the conductive tracks.

Separately or in combination, the attachable electrical connector is any one of: a bond wire, or a metal clip, or a ribbon.

A method of forming a semiconductor device is disclosed. According to an embodiment, the method comprises providing a semiconductor die comprising a main surface, a rear surface, outer edge sides extending between the main and rear surfaces, and a first conductive bond pad disposed on the main surface, forming an electrically insulating mold compound body around the outer edge sides of the semiconductor die such that the main surface of the semiconductor die is exposed from an upper surface of the mold compound body, forming a first metallization layer on the upper surface of the mold compound body and on the main surface of the semiconductor die, and forming a first bond pad extension in the first metallization layer. The first bond pad extension overlaps with the upper surface of the mold compound body. The first bond pad extension is conductively connected with the first conductive bond pad. The first bond pad extension is an externally accessible point of electrical contact of the semiconductor device.

Separately or in combination, forming the first metallization layer comprises structuring the first metallization layer to include a first continuous region of the first metallization layer that overlaps with the semiconductor die and the mold compound body, the first continuous region forms the first bond pad extension and a first bond pad connector that at least partially overlaps with the first conductive bond pad, and the method further comprises forming a direct electrical connection between the first continuous region and the first bond pad connector.

Separately or in combination, the mold compound body is formed to include a first appendage that adjoins a first one of the outer edge sides of the semiconductor die and laterally extends away from the first outer edge side, and the first bond pad connector laterally extends over the first outer edge side of the semiconductor die and merges with the first bond pad extension.

Separately or in combination, the method further comprises, after forming the mold compound body forming a dielectric layer that covers the main surface of the semiconductor die and the upper surface of the mold compound body and exposes the first conductive bond pad from the dielectric layer, and forming the first continuous region of the first metallization layer on the dielectric layer.

Separately or in combination, forming the first metallization layer comprises performing a plating process after forming the dielectric layer.

Separately or in combination, the method further includes attaching an attachable electrical connector to the first bond pad extension, and the attachable electrical connector is any one of: a bond wire, or a metal clip, or a ribbon.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A and 1B, depicts a semiconductor die, according to an embodiment.

FIG. 2, which includes FIGS. 2A and 2B, depicts a semiconductor device that includes a semiconductor die, mold compound appendages and bond pad extensions.

FIG. 5, which includes FIGS. 5A and 5B, depicts a method of forming a mold compound body around a semiconductor die, according to an embodiment.

FIG. 7, which includes FIGS. 7A, 7B and 7C, illustrates forming a dielectric layer on the reconstituted wafer, according to an embodiment.

FIG. 8, which includes FIGS. 8A and 8B, illustrates forming a first metallization layer on the reconstituted wafer, according to an embodiment.

DETAILED DESCRIPTION

Described herein is a semiconductor device with advantageously large bond pad area relative to the size of the semiconductor die. In more detail, the semiconductor device includes a semiconductor die and mold compound body that forms at least one appendage adjoining an outer edge side of the semiconductor die. The mold compound body includes an electrically insulating material such as an epoxy-based mold compound. A metallization layer is formed on the upper surface of the mold compound body and the main surface of the semiconductor die. The metallization layer is structured to provide a bond pad extension that laterally extends over the mold compound body. This bond pad extension is conductively connected to a bond pad on the semiconductor die and provides a point of external electrical contact.

The mold compound body advantageously expands the surface area of the device beyond what is provided by the semiconductor die. As a result, the bond pad extension can be formed to be longer and/or larger than the underlying bond pad to which it is connected to. This in turn enables a greater number and/or size of attachable electrical connectors, e.g., bond wires, clips, ribbons, etc., to be attached to the bond pad extensions in comparison to a direct connection to the bond pad on the semiconductor die. Moreover, the bond pad extension and mold appendage design advantageously provide a stress reducing connection interface for the attachable electrical connectors. In a conventional configuration, the process of forming wire bonds on the bond pads of the semiconductor die can place potentially harmful stress on the semiconductor die. By contrast, the bond pad extension and mold appendage design advantageously move the bond wire connection interface away from the lateral footprint of the semiconductor die and over a mechanically stable platform of mold compound.

Figure 1A:
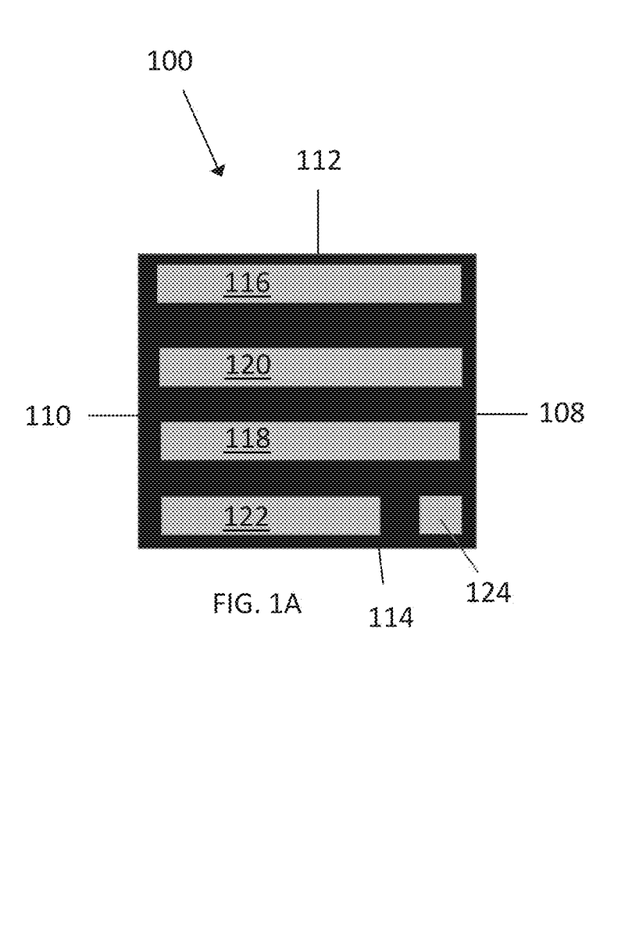
FIG. 1A depicts a plan view of the semiconductor die.
Figure 1B:
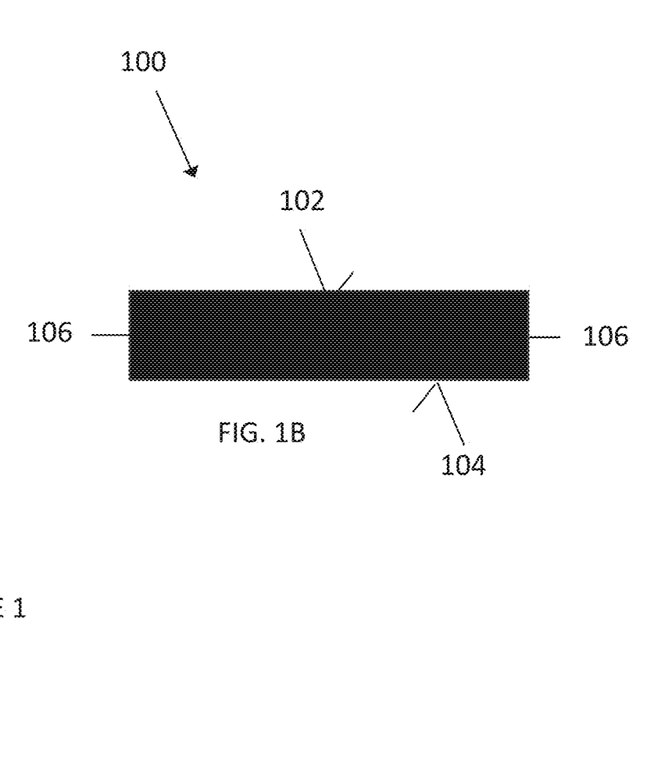
FIG. 1B depicts a side view of the semiconductor die.

Referring to FIG. 1, a semiconductor die 100 is depicted, according to an embodiment. The semiconductor die 100 includes a main surface 102 and a rear surface 104 opposite the main surface 102. Outer edge sides 106 of the semiconductor die 100 vertically extend between the main and rear surfaces 102, 104. In the depicted embodiment, these outer edge sides 106 the semiconductor die 100 include first, second, third and fourth outer edge sides 108, 110, 112, and 114 that form a rectangle with one another, as shown in the planar view of FIG. 1A.

The semiconductor die 100 includes a plurality of conductive bond pads disposed on the main surface 102. In the depicted example, the semiconductor die 100 includes first, second, third, fourth and fifth bond pads 116, 118, 120, 122, and 124. Each of the first, second, third and fourth bond pads 116, 118, 120, and 122 are elongated in a first direction that is perpendicular to the first outer edge side 108 of the semiconductor die 100. The first, second, third, fourth and fifth bond pads 116, 118, 120, 122, and 124 are each configured as terminal connections to underlying devices integrated in the semiconductor die 100. For example, in an embodiment, the semiconductor die 100 is configured as a MOSFET device, the first and second bond pads 116, 118 are configured as a drain connection to the MOSFET, the third and fourth bond pads 120, 122 are configured as a source connection to the MOSFET, and the fifth bond pad 124 is configured as a gate connection to the MOSFET.

Generally speaking, the semiconductor die 100 can have any of a wide variety of device configurations. Examples of these device configurations include transistor configurations, such as MOSFETs (metal-oxide semiconductor field-effect transistor), LDMOS (laterally-diffused metal-oxide semiconductor) devices, and HEMT (high electron mobility transistor) devices, etc. More generally, the semiconductor die 100 can include any kind of integrated circuit or discrete device. In one embodiment, the semiconductor die 100 is configured as a power switching device that is rated to control voltages of at least 200V or more. In one embodiment, the semiconductor die 100 includes III-V semiconductor materials such as GaN, GaAs, InGaN, AlGaN, etc.

Figure 2A:
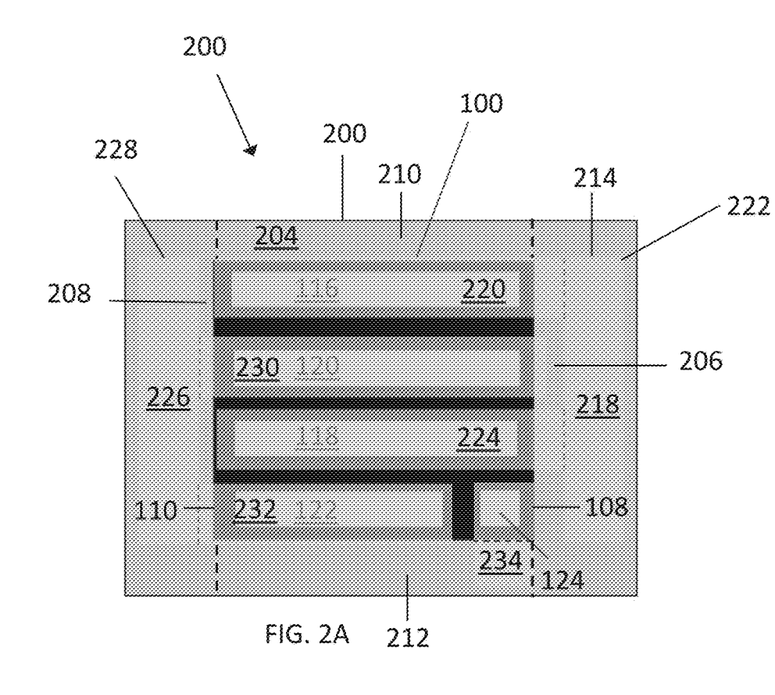
FIG. 2A depicts a plan view of the semiconductor device.

Referring to FIG. 2, a semiconductor device 200 is depicted, according to an embodiment. In the semiconductor device 200 of FIG. 2, an electrically insulating mold compound body 202 is formed around the outer edge sides 106 of the semiconductor die 100. Generally speaking, the mold compound body 202 can include formable semiconductor encapsulant materials, e.g., epoxy materials, thermosetting plastics, thermoplastic, etc. The mold compound body 202 is formed such that the main surface 102 of the semiconductor die 100 is at least partially exposed from an upper surface 204 of the mold compound body 202. As shown, the main surface 102 of the semiconductor die 100 is completely exposed from the upper surface 204 of the mold compound body 202. Alternatively, the mold compound body 202 may encroach over the outer edge sides 106 of the semiconductor die 100, provided that the bond pads are at least partially exposed from the mold compound body 202.

Figure 7A:
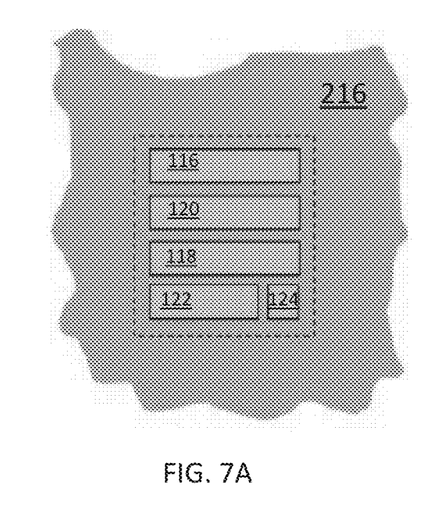
FIG. 7A illustrates a plan-view of the reconstituted wafer.

The mold compound body 202 is formed such that the upper surface 204 of the mold compound body 202 is substantially parallel to the main surface 102 of the semiconductor die 100. More particularly, the upper surface 204 of the mold compound body 202 can be substantially coplanar with the main surface 102 of the semiconductor die 100, e.g., as shown in FIG. 2. In other embodiments, the upper surface 204 of the mold compound body 202 can be vertically offset from the main surface 102 of the semiconductor die 100, e.g., as shown in FIG. 7C.

The mold compound body 202 forms appendages that provide an additional lateral area adjacent to the edge sides of the semiconductor die 100 for the formation of structures thereon. In particular, the mold compound body 202 includes a first appendage 206 that adjoins and laterally extends away from the first outer edge side 108 of the semiconductor die 100. Likewise, the mold compound body 202 includes a second appendage 208 that adjoins and laterally extends away from the second outer edge side 110 of the semiconductor die 100. In the depicted embodiment, the mold compound body 202 is formed to completely surround the semiconductor die 100. As a result, the mold compound body 202 includes first, second, third and fourth appendages 206, 208, 210, and 212 that respectively extend away from the first, second, third, and fourth outer edge sides 108, 110, 112, and 114 of the semiconductor die 100. Alternatively, one or more of these appendages can be omitted such that one or more of the outer edge sides 106 of the semiconductor die 100 is exposed from the mold compound body 202.

The semiconductor device 200 includes a first metallization layer 214 that is formed on the upper surface 204 of the mold compound body 202 and on the main surface 102 of the semiconductor die 100. The first metallization layer 214 can include a conductive metal, e.g., copper, gold, aluminum, nickel, etc., and alloys thereof.

Figure 2B:
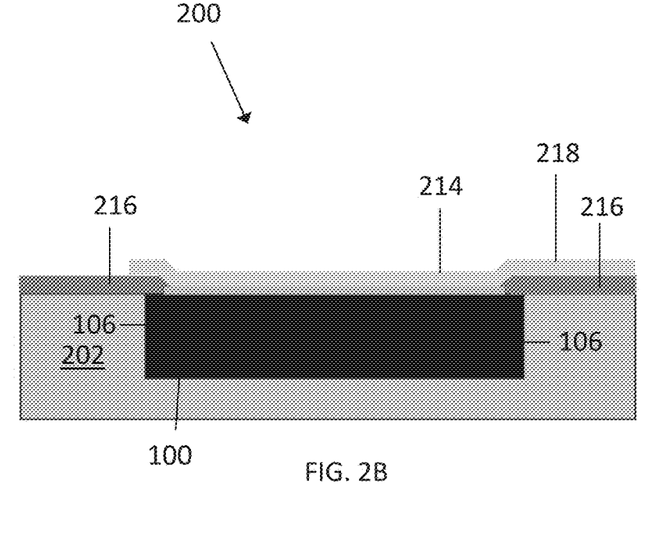
FIG. 2B depicts a cross-sectional view of the semiconductor device.

Optionally, the semiconductor device 200 may include a dielectric layer 216, as shown in FIG. 2B. The dielectric layer 216 can include any of a wide variety of materials that electrically insulate and/or protect semiconductor devices, e.g., from moisture. Examples of these materials include imides, oxides, nitrides, oxynitrides, epoxies, polybenzoxazoles, etc., and combinations thereof. The dielectric layer 216 is disposed at least over an interface between the outer edge sides 106 of the semiconductor die 100 and the mold compound body 202. The dielectric layer 216 can be formed to cover the upper surface 204 of the mold compound body 202 in the appendages, e.g., as shown in FIG. 2B. Alternatively, the dielectric layer 216 can be structured such that most of the upper surface 204 of the mold compound body 202 in the appendages is exposed from the dielectric layer 216, e.g., as shown in FIG. 7A.

A first bond pad extension 218 is formed in the first metallization layer 214. The first bond pad extension 218 overlaps with the upper surface 204 of the mold compound body 202. In other words, the first bond pad extension 218 is a region of the first metallization layer 214 that is disposed directly over the mold compound body 202. As will be explained in further detail below, the first bond pad extension 218 may be part of a continuous structure that also overlaps with the semiconductor die 100. However, for the purposes of the present disclosure, the first bond pad extension 218 refers only to the portions of the first metallization layer 214 that are directly above the mold compound body 202, and outside of a lateral perimeter of the semiconductor die 100, as defined by the outer edge sides 106.

The first bond pad extension 218 is an externally accessible point of electrical contact of the semiconductor device 200. This means that the first bond pad extension 218 has an exposed conductive surface (i.e., a surface of the first metallization layer 214) that is available for direct contact and/or electrical connection with an attachable electrical connector, e.g., wire bond, clip, ribbon, etc.

The first bond pad extension 218 is conductively connected with the first conductive bond pad 116. This means that a permanent and low-ohmic connection exists between the first bond pad extension 218 and the first conductive bond pad 116. Hence, the first bond pad extension 218 is part of the same electrical node as the first conductive bond pad 118. In the depicted embodiment, the conductive connection between the first bond pad extension 218 and the first conductive bond pad 116 is provided by a first bond pad connector 220 that is formed the first metallization layer 214. The first bond pad connector 220 at least partially overlaps with the first conductive bond pad 116, meaning that at least a portion of the first bond pad connector 220 is disposed directly over the first conductive bond pad 116. The first bond pad connector 220 is in direct electrical contact with the first conductive pad. This means that either the first bond pad connector 220 directly physically contacts the first bond pad in the overlapping region or a conductive interface material or structure, e.g., solder, sinter, conductive glue, via, etc. is provided between the first bond pad connector 220 and the first bond pad in the overlapping region.

According to an embodiment, the first metallization layer 214 is structured to include a first continuous region 222 that overlaps with the semiconductor die 100 and the mold compound body 202 and includes the first bond pad extension 218 and the first bond pad connector 220. In the depicted embodiment, the first continuous region 222 of the first metallization layer 214 is formed such that the first bond pad connector 220 laterally extends over the first outer edge side 108 of the semiconductor die 100 and merges with the first bond pad extension 218 at a location that is over the first appendage 206.

More generally, a variety of techniques and/or structures can be used to conductively connect the first conductive bond pad 116 to the first bond pad extension 218. For example, instead of forming the first bond pad extension 218 and the first bond pad connector 220 as a continuous region of the first metallization layer 214, these two elements can be physically separated elements that are electrically connected to one another by additional conductive structures, e.g. bond wires, ribbons, metal clips, further metallization layers, etc. Alternatively, the first bond pad connector 220 can be omitted altogether. In that case, the first bond pad extension 218 can be connected to the first conductive bond pad 116 using additional conductive structures that directly electrically contact the first conductive bond pad 116.

According to an embodiment, the first bond pad extension 218 is larger in at least one dimension than the first conductive bond pad 116. In one example of this concept, according to an embodiment, the first bond pad extension 218 is elongated and has a greater length than the first conductive bond pad 116. As a result, more electrical connectors, e.g., bond wires, can be directly attached to the first bond pad extension 218 sequentially along a length direction of the first bond pad extension 218 than could be directly attached to the first conductive bond pad 116 sequentially along the length direction of the first conductive bond pad 116. In another example of this concept, according to an embodiment, an area of the first bond pad extension 218 is greater than an area of the first bond pad. As a result, the first bond pad extension 218 can accommodate a greater number of electrical connectors and/or larger sized electrical connectors than the first bond pad.

According to an embodiment, the first bond pad extension 218 is conductively connected to two or more physically separated bond pads of the semiconductor die 100. For example, as shown, the semiconductor die 100 includes a second conductive bond pad 118 disposed on the main surface 102 and physically separated from the first conductive bond pad 116. The first metallization layer 214 is structured such that the first continuous region 222 further includes a second bond pad connector 224 that at least partially overlaps with and is in direct electrical contact with the second conductive bond pad 118. The second bond pad connector 224 laterally extends over the first outer edge side 106 of the semiconductor die 100 and merges with the first bond pad extension 218 in a similar manner as previously described with respect to the first bond pad connector 220. More generally, the conductive connection between the second conductive bond pad 118 and the first bond pad extension 218 can be effectuated according to any of the previously described techniques.

According to an embodiment, the semiconductor device 200 further includes a second bond pad extension 226 that is conductively connected to a different bond pad of the semiconductor die 100 than the first bond pad extension 218. The second bond pad extension 226 can be formed in a similar manner as the first bond pad extension 218. Hence, the second bond pad extension 226 can be a structured portion of the first metallization layer 214 that overlaps with the upper surface 204 of the mold compound body 202. In the depicted embodiment, the second bond pad extension 226 overlaps with the upper surface 204 of the mold compound body 202 in the second appendage 208 of the mold compound body 202. Hence, the second bond pad extension 226 is disposed on an opposite side of the semiconductor die 100 as the first bond pad extension 218.

The second bond pad extension 226 is conductively connected with the third conductive bond pad 120, which is disposed on the main surface 102 in between the first and second conductive bond pads 116, 118. This conductive connection can be effectuated in a similar manner as previously described with reference to the first bond pad extension 218. Hence, as shown, the first metallization layer 214 is structured to include a second continuous region 228 that overlaps with the semiconductor die 100 and the mold compound body 202. The second continuous region 228 forms the second bond pad extension 226 and a third bond pad connector 230 that is in direct electrical contact with the third conductive bond pad 120 in a similar manner as previously described. Moreover, as shown, the first metallization layer 214 is structured such that the second continuous region 228 further includes a fourth bond pad connector 232 that is in direct electrical contact with the fourth conductive bond pad 122 in a similar manner as previously described. Alternatively, the conductive connections between the second bond pad extension 226 and the third and fourth conductive bond pads 120, 122 can be effectuated according to any of the techniques previously described with reference to the first bond pad extension 218 and the first and second conductive bond pads 116, 122.

According to an embodiment, one or both of the first and second bond pad extensions 226 are elongated in a different direction as the bond pads to which they are connected to. For example, as shown, each of the first, second, third and fourth bond conductive pads 116, 118, 120 and 122 are elongated in a first direction that is substantially perpendicular to the first outer edge side 108 of the semiconductor die 100. Moreover, the first and second bond pad extensions 218, 226 are elongated in a second direction that is perpendicular to the first direction, i.e., parallel to the first outer edge side 108 of the semiconductor die 100.

According to an embodiment, the semiconductor device 200 further includes a third bond pad extension 234 that is conductively connected to a different bond pad of the semiconductor die 100 than the first and second bond pad extensions 218, 226. The third bond pad extension 234 can be formed in a similar manner as the first and second bond pad extensions 218, 216 as previously described. Hence, the third bond pad extension can be formed in the first metallization layer 214 over the upper surface 204 of the mold compound body 202. In the depicted embodiment, the third bond pad extension overlaps with the upper surface 204 of the mold compound body 202 in the third appendage 212. The third bond pad extension is conductively connected with the fifth conductive bond pad 124 in a similar manner as previously described with reference to the first and second bond pad extensions 218, 226.

Figure 3:
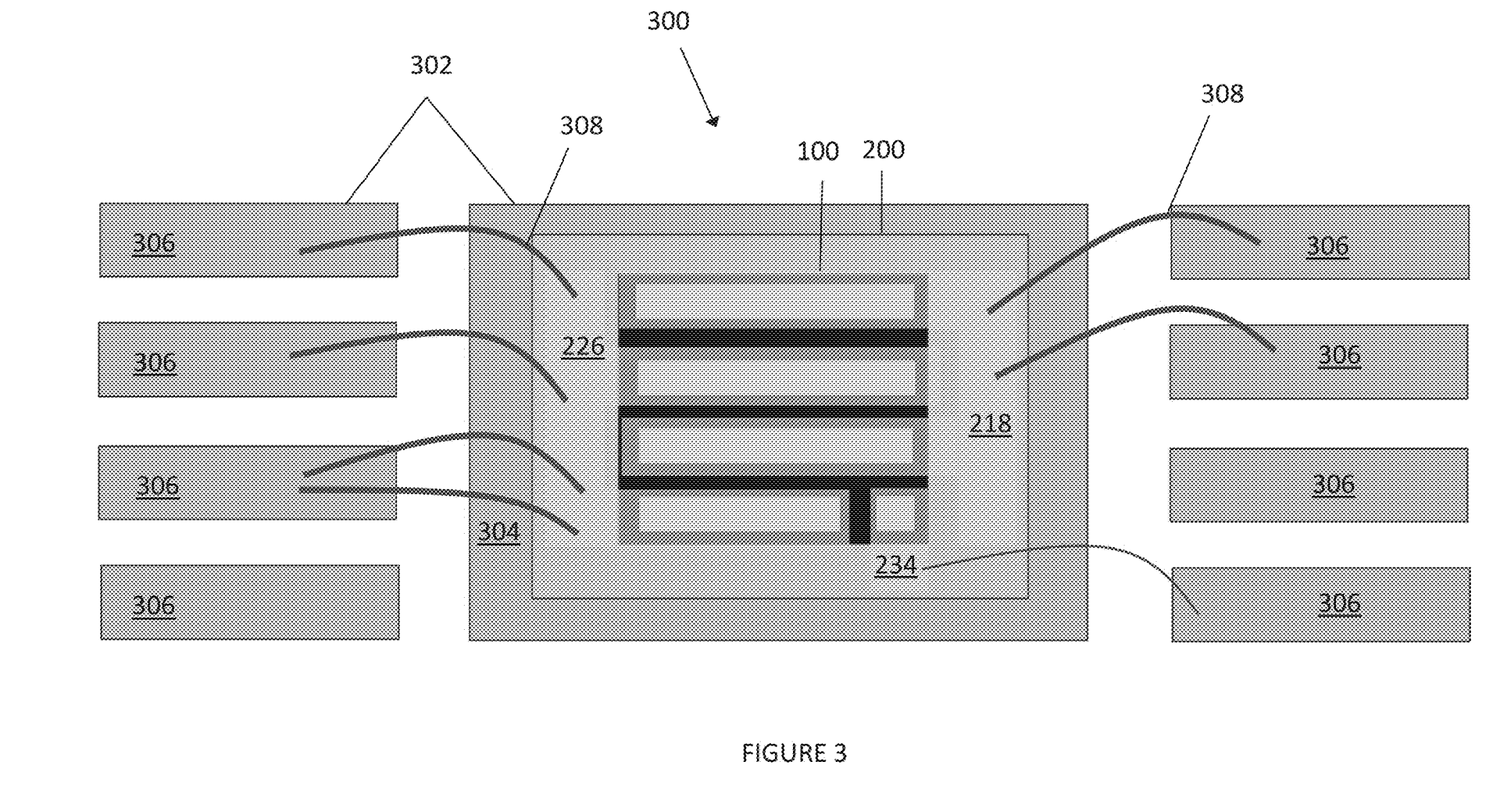
FIG. 3 depicts the semiconductor device mounted and electrically connected to a lead frame, according to an embodiment.
Figure 4:
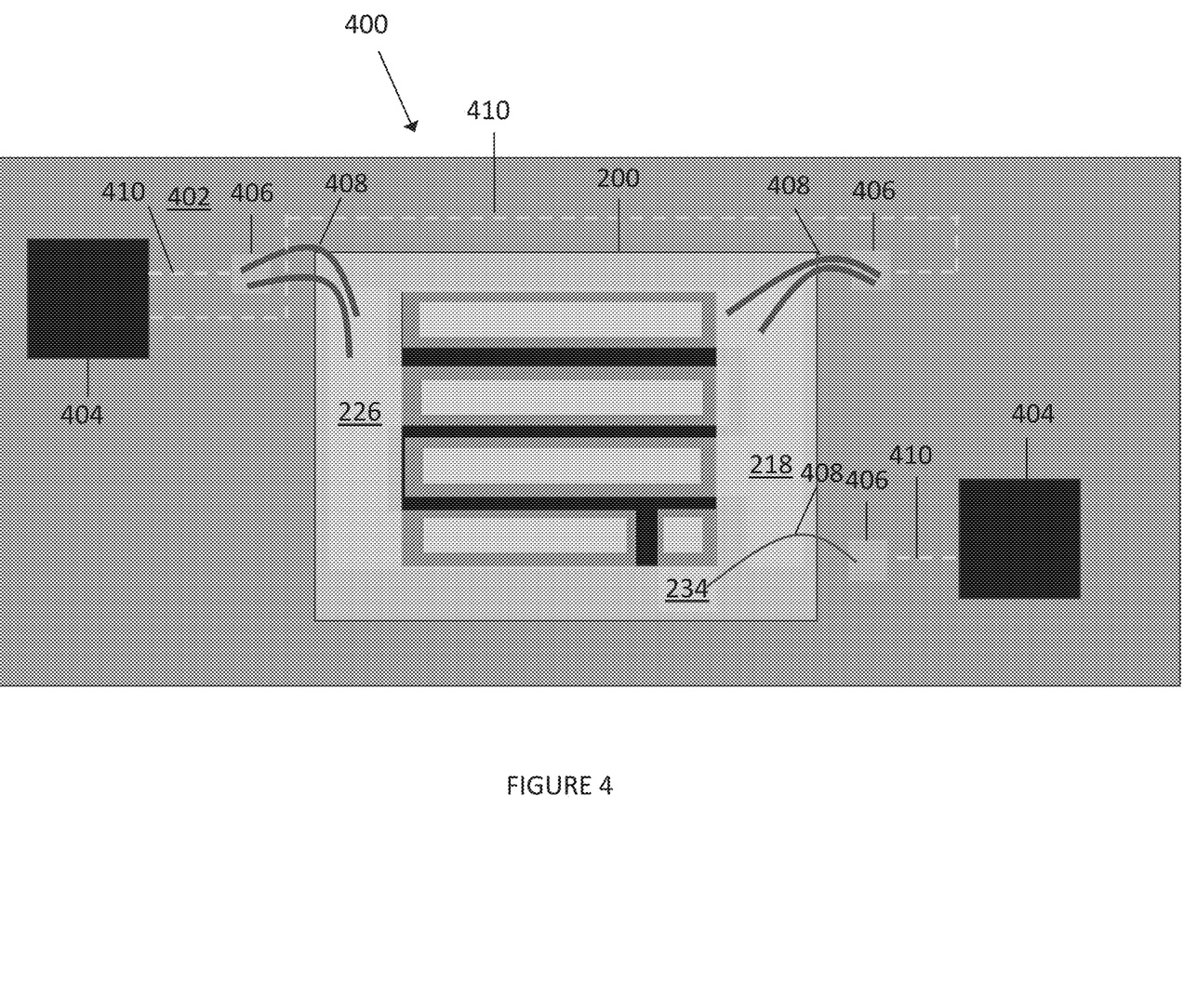
FIG. 4 depicts the semiconductor device mounted and electrically connected to a circuit board, according to an embodiment.

Referring to FIGS. 3-4, different embodiments of an assembly that includes the semiconductor device 200 are depicted. In these embodiments, the semiconductor device 200 including the semiconductor die 100, the mold compound body 202, and the bond pad extensions 218, 226 and 234 is assembled in the same way as a conventional semiconductor die 100 that does not include the mold compound body 202 with the bond pad extensions 218, 226 and 234. In each case, the assembly includes an electrical contact that is external to the semiconductor device 200. This electrical contact is a separate conductive surface, e.g., bond pad, lead, socket, etc., that is accessible for electrical connection when the semiconductor device 200 is mounted on the assembly. Moreover, in each case, the electrical contact is conductively connected to one of the first, second, and third bond pad extensions 218, 226 and 234 by an attachable electrical connector. An attachable electrical connector is a discrete conductive structure that can form a permanent mechanical and electrical connection with a planar conductive surface, e.g., by direct contact between the elements or with a conductive adhesive such as solder, sinter, conductive glue, etc., between the elements. Examples of attachable electrical connectors include bond wires, metal clips, and ribbons.

Referring to FIG. 3, the semiconductor device 200 is mounted in an assembly 300 that includes an electrically conductive lead frame 302. The lead frame 302 includes a centrally located die paddle 304 and a plurality of electrically conductive leads 306 extending away from the die paddle 304. The lead frame 302 can be formed from an electrically conductive metal such as copper, aluminum, alloys thereof, etc. The semiconductor device 200 is mounted on the lead frame 302 with the first, second, and third bond pad extensions 218, 226, and 234 facing away from the die paddle. An adhesive, e.g., solder, glue, tape, etc., can be provided between the semiconductor device 200 and the die paddle 304 to effectuate this mounting.

In this example, the conductive leads 306 provide the electrical contact points of the assembly 300 that are external to the semiconductor device 200. Moreover, bond wires 308 provide a conductive connection between the first, second, and third bond pad extensions 218, 226, and 234 and the conductive leads 306. Hence, the conductive leads 306 are in low ohmic connection with the bond pads of the semiconductor die 100. As shown, the only portion of the semiconductor device 200 that is contacted by the bond wires 308 is the first, second, and third bond pad extensions 218, 226, and 234. This connection placement advantageously mitigates stress applied to the semiconductor die 100 during the wire bonding process. Alternatively, bond wires may contact the semiconductor device 200 outside of the first, second, and third bond pad extensions 218, 226, and 234, e.g., at one or more of the bond pad connectors 220, 224, 230, 232, for additional current carrying capability, if necessary.

The assembly of FIG. 3 can be used to form a complete packaged semiconductor device by performing an encapsulation process wherein a further electrically insulating mold compound (not shown), e.g., epoxy, thermosetting plastic, ceramic, thermoplastic, etc., is used to encapsulate the semiconductor device 200 and bond wires 308.

Referring to FIG. 4, the semiconductor device 200 is mounted in an assembly 400 that includes a circuit board 402. Generally speaking, the circuit board 402 may include an insulative substrate with commonly known PCB materials, e.g., pre-impregnated composite fibers (FR materials, CEM materials, etc.) and one or more metallization layers. Electrical components 404 are mounted on the circuit board. These electrical components 404 can include integrated semiconductor components, e.g., controllers, logic devices, amplifiers, as well as passive components, e.g., capacitors, inductors, etc.

The semiconductor device 200 is mounted on a receptacle portion of the circuit board 402 with the first, second, and third bond pad extensions 218, 226, and 234 facing away from the circuit board 402. An adhesive, e.g., solder, glue, tape, etc., can be provided between the semiconductor device 200 and the circuit board 402 to effectuate this mounting. In this example, the circuit board 404 includes discrete bond pads 406 that provide the electrical contact points of the assembly that are external to the semiconductor device 200. Moreover, bond wires 408 provide a conductive connection between the first, second, and third bond pad extensions 218, 226, and 234 and the bond pads 406. The bond pads 408 connect to conductive tracks 410, which are schematically represented by dashed lines in FIG. 4. These conductive tracks 410 form a conductive connection with terminals of the electrical components 404.

Figure 5A:
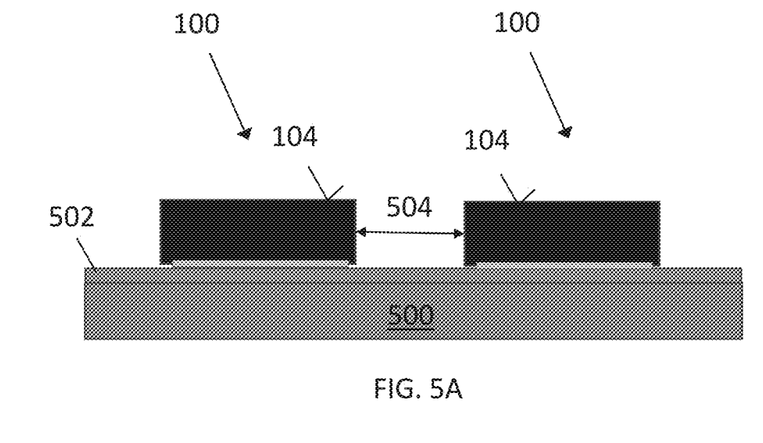
FIG. 5A depicts placing semiconductor dies on a temporary carrier.
Figure 5B:
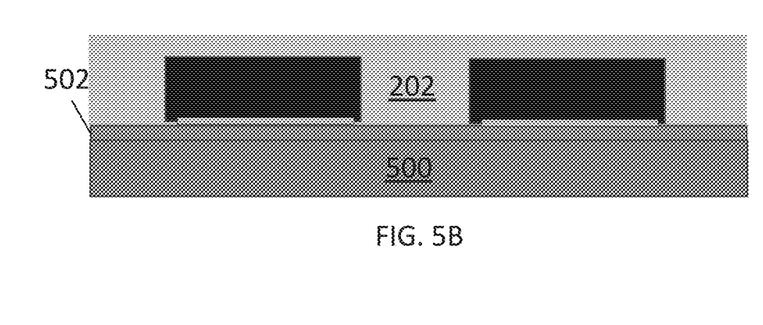
FIG. 5B depicts forming mold compound on the temporary carrier.

Referring to FIG. 5, a technique for forming the mold compound body 202 around the semiconductor die 100 is depicted, according to an embodiment. According to this technique, a plurality of semiconductor dies 100 are placed face-down on a temporary carrier 500, as shown in FIG. 5A. An adhesive layer 502 may be provided on the temporary carrier 500 to assist with eventual separation of the molded structure from the temporary carrier 500. The semiconductor dies 100 are placed on the temporary carrier 500 with a lateral space 504 separating the outer edge sides 106 of immediately adjacent semiconductor dies 100. Subsequently, a molding process is performed that fills the lateral space 504 with the mold material, as shown in FIG. 5B. Exemplary techniques for this molding process include injection molding, compression molding, transfer molding, etc. In each case, a mold tool (not shown) provides a cavity for the injection of liquified molding compound. After the liquified molding compound hardens, the mold tool is removed.

Figure 6:
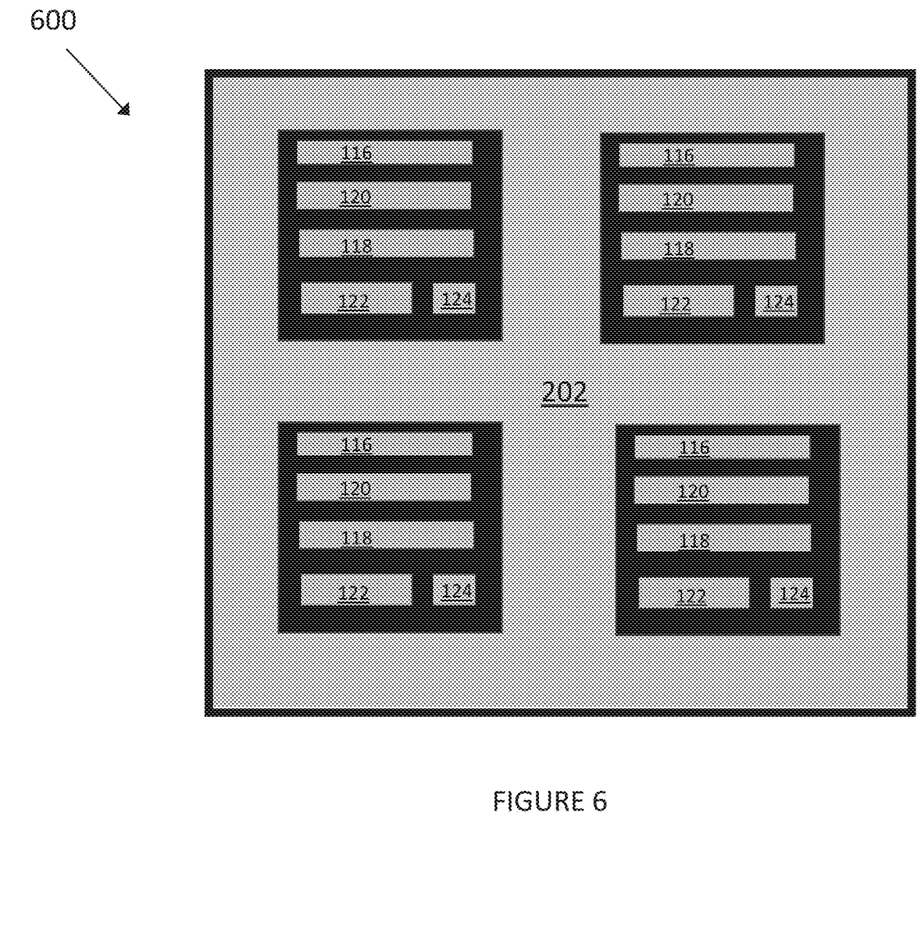
FIG. 6 depicts a reconstituted wafer that includes the semiconductor dies and mold compound, according to an embodiment.

Referring to FIG. 6, a reconstituted wafer 600 produced from the molding process of FIG. 5 is shown. This reconstituted wafer 600 can be processed and handled in a similar manner as a conventional semiconductor wafer. Different from a conventional wafer, the reconstituted wafer 600 includes the mold compound body 202 in the lateral space 502 between the semiconductor dies 100. These regions provide the appendages of the mold compound body 202 as previously described. Hence, a desired size of the appendages can be achieved by appropriately selecting a separation distance between the semiconductor dies 100 in the molding step of FIG. 5.

Figure 7B:
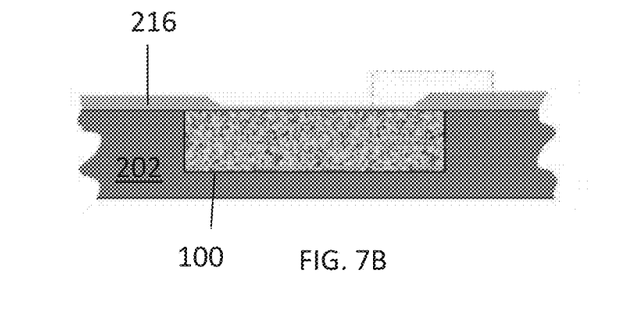
FIG. 7B illustrates a cross-sectional view of the reconstituted wafer.
Figure 7C:
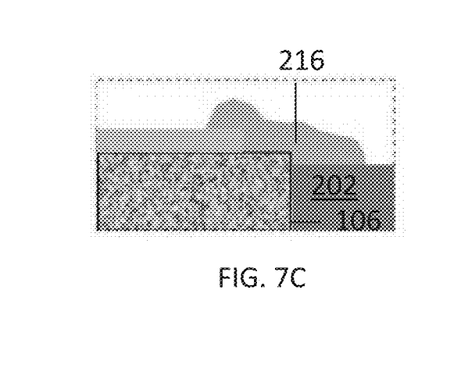
FIG. 7C illustrates a close-up cross-sectional view of the reconstituted wafer, according to an embodiment.

Referring to FIG. 7, the dielectric layer 216 is formed on the reconstituted wafer 600. The dielectric layer 216 can be formed by a deposition technique, e.g., spin coating, printing, lamination, etc. According to one technique, the dielectric layer 216 is initially deposited as a complete layer that covers the upper surface of the reconstituted wafer 600. Subsequently, this complete dielectric layer 216 is structured, e.g., using lithography techniques, to expose portions of the semiconductor dies 100 including the conducive bond pads 116, 118, 120, 122, 124, e.g., as shown in FIG. 7A.

FIG. 7C depicts an optional structuring of the dielectric layer 216. In this embodiment, the dielectric layer 216 is structured such that the upper surface 204 of the mold compound body 202 is mostly exposed from the dielectric layer 216. In this example, the dielectric layer 216 seals and protects the interface between the semiconductor die 100 and the mold compound body 202. However, by localizing the dielectric layer 216 to this region, the bond pad extensions 218, 226, and 234 can be formed directly on the upper surface 204 of the mold compound body 202. This provides a firmer and more mechanically stable surface for the attachment of electrical connectors (e.g., bond wires) on the bond pad extensions 218, 226, and 234.

Figure 8A:
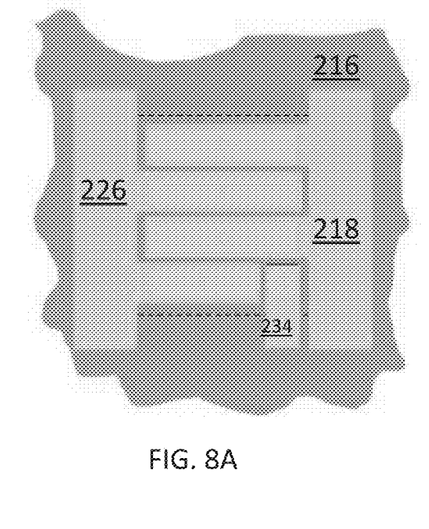
FIG. 8A illustrates a plan-view of the reconstituted wafer.
Figure 8B:
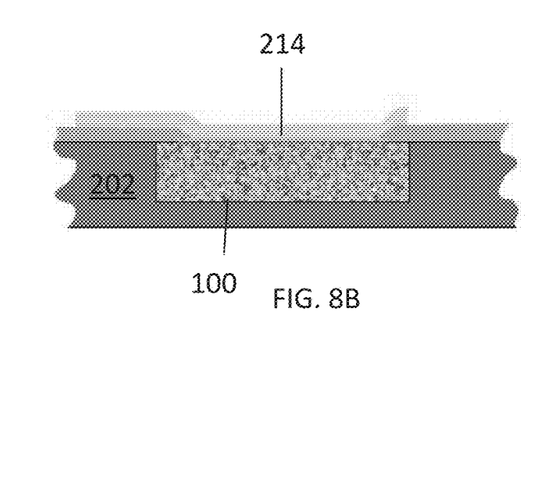
FIG. 8B illustrates a cross-sectional view of the reconstituted wafer.

Referring to FIG. 8, the first metallization layer 214 is formed on the reconstituted wafer 600. According to an embodiment, the first metallization layer 214 is formed by a metal deposition technique, e.g., sputtering, electroplating, electroless plating, etc. Other methods are possible as well, e.g., printing of a sinter layer and sintering. The various structural features of the first metallization layer 214 (e.g., the first bond pad extension 218, the first bond pad connector 220) can be formed by known structuring techniques, e.g., lithography, etching, etc.

After structuring the first metallization layer 214 as described above, the reconstituted wafer 600 can be cut, e.g., by sawing or other cutting techniques, to provide discrete ones of the semiconductor devices 200.

As used herein, "elongated" means that the element in question has a greater maximum extension in a first cartesian coordinate direction (e.g., the "X" direction) than a second cartesian coordinate direction that is orthogonal to the first direction (e.g., the "Y" direction).

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

The term "substantially" as used herein encompasses absolute conformity with the specified requirement as well as minor deviations from absolute conformity with the requirement due to manufacturing process variations, assembly, and other factors that may cause a deviation from the design goal. Provided that the deviation is within process tolerances so as to achieve practical conformity and the components described herein are able to function according to the application requirements, the term "substantially" encompasses any of these deviations.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor device, comprising:
a semiconductor die comprising a main surface, a rear surface, outer edge sides extending between the main and rear surfaces, and a first conductive bond pad disposed on the main surface;
an electrically insulating mold compound body that is formed around the outer edge sides of the semiconductor die such that the main surface of the semiconductor die is exposed from an upper surface of the mold compound body;
a first metallization layer formed on the upper surface of the mold compound body and on the main surface of the semiconductor die; and
a first bond pad extension formed in the first metallization layer,
wherein the first bond pad extension overlaps with the upper surface of the mold compound body,
wherein the first bond pad extension is conductively connected with the first conductive bond pad
wherein the first bond pad extension is an externally accessible point of electrical contact of the semiconductor device,
wherein the first metallization layer is structured to include a first continuous region of the first metallization layer that overlaps with the semiconductor die and the mold compound body, wherein the first continuous region forms the first bond pad extension and a first bond pad connector that at least partially overlaps with the first conductive bond pad and is in direct electrical contact with the first conductive bond pad,
wherein the mold compound body is formed to include a first appendage that adjoins a first one of the outer edge sides of the semiconductor die and laterally extends away from the first edge side, and
wherein the first bond pad connector laterally extends over the first edge side of the semiconductor die and merges with the first bond pad extension.

2. The semiconductor device of claim 1, wherein the upper surface of the mold compound body in the first appendage is substantially coplanar with the main surface of the semiconductor die.

3. The semiconductor device of claim 1, wherein the first conductive bond pad and the first bond pad extension are elongated, and wherein a length of the first bond pad extension is greater than a length of the first conductive bond pad.

4. The semiconductor device of claim 1, wherein an area of the first bond pad extension is greater than an area of the first bond pad.

5. The semiconductor device of claim 1, wherein the semiconductor die further comprises a second conductive bond pad disposed on the main surface and physically separated from the first bond pad, wherein the first metallization layer is structured such that the first continuous region further comprises a second bond pad connector that at least partially overlaps with and is in direct electrical contact with the second conductive bond pad, and wherein the second bond pad connector is conductively connected with the first bond pad extension.

6. The semiconductor device of claim 5, wherein the semiconductor die further comprises a third conductive bond pad disposed on the main surface in between the first and second conductive bond pads, wherein the semiconductor device further comprises a second bond pad extension formed in the first metallization layer, wherein the second bond pad extension overlaps with the upper surface of the mold compound body, wherein the second bond pad extension is conductively connected with the third conductive bond pad, and wherein the second bond pad extension is an externally accessible point of electrical contact of the semiconductor device.

7. The semiconductor device of claim 6, wherein the mold compound body is formed to include a second appendage that is opposite from the first edge side, wherein the second appendage laterally extends away from the second edge side, wherein the first metallization layer is structured to include a second continuous region of the first metallization layer that overlaps with the semiconductor die and the mold compound body, wherein the second continuous region forms the second bond pad extension and a third bond pad connector that at least partially overlaps with and is in direct electrical contact with the third conductive bond pad.

8. The semiconductor device of claim 7, wherein the first, second, and third conductive bond pads are each elongated in a first direction that is perpendicular to the first edge sides, and wherein the first and second bond pad extensions are each elongated in a second direction that is perpendicular to the first direction.

9. An assembly, comprising:
a semiconductor device, comprising:
a semiconductor die comprising a main surface, a rear surface, outer edge sides extending between the main and rear surfaces, and a first conductive bond pad disposed on the main surface;
an electrically insulating mold compound body that is formed around the outer edge sides of the semiconductor die such that the main surface of the semiconductor die is exposed from an upper surface of the mold compound body;
a first metallization layer formed on the upper surface of the mold compound body and on the main surface of the semiconductor die; and
a first bond pad extension that is formed in the first metallization layer and is conductively connected with the first conductive bond pad;
an electrical contact point external to the semiconductor device;

an attachable electrical connector forming a conductive connection between the first bond pad extension and the electrical contact point; and
an electrically conductive lead frame that comprises a die paddle and a plurality of electrically conductive leads extending away from the die paddle, and
wherein the semiconductor device is mounted on the die paddle, and wherein the electrical contact point is one of the leads.

10. The assembly of claim 9, wherein the attachable electrical connector is any one of: a bond wire, or a metal clip, or a ribbon.

11. A method of forming a semiconductor device, the method comprising:
providing a semiconductor die comprising a main surface, a rear surface, outer edge sides extending between the main and rear surfaces, and a first conductive bond pad disposed on the main surface;
forming an electrically insulating mold compound body around the outer edge sides of the semiconductor die such that the main surface of the semiconductor die is exposed from an upper surface of the mold compound body;
forming a first metallization layer on the upper surface of the mold compound body and on the main surface of the semiconductor die; and
forming a first bond pad extension in the first metallization layer,
wherein the first bond pad extension overlaps with the upper surface of the mold compound body,
wherein the first bond pad extension is conductively connected with the first conductive bond pad, and
wherein the first bond pad extension is an externally accessible point of electrical contact of the semiconductor device,
wherein forming the first metallization layer comprises structuring the first metallization layer to include a first continuous region of the first metallization layer that overlaps with the semiconductor die and the mold compound body, wherein the first continuous region forms the first bond pad extension and a first bond pad connector that at least partially overlaps with the first conductive bond pad, and wherein the method further comprises forming a direct electrical connection between the first continuous region and the first bond pad connector, and
wherein the mold compound body is formed to include a first appendage that adjoins a first one of the outer edge sides of the semiconductor die and laterally extends away from the first edge side, and wherein the first bond pad connector laterally extends over the first edge side of the semiconductor die and merges with the first bond pad extension.

12. The method of claim 11, further comprising, after forming the mold compound body:
forming a dielectric layer that covers the main surface of the semiconductor die and the upper surface of the mold compound body and exposes the first conductive bond pad from the dielectric layer; and
forming the first continuous region of the first metallization layer on the dielectric layer.

13. The method of claim 12, wherein forming the first metallization layer comprises performing a plating process after forming the dielectric layer.

14. The method of claim 11, further comprising:
attaching an attachable electrical connector to the first bond pad extension, wherein the attachable electrical connector is a bond wire, or a metal clip, or a ribbon.

\* \* \* \* \*

UNITED STATES PATENT AND TRADEMARK OFFICE
CERTIFICATE OF CORRECTION

PATENT NO. : 11,081,455 B2
APPLICATION NO. : 16/397219
DATED : August 3, 2021
INVENTOR(S) : C. Cha et al.

Page 1 of 1

It is certified that error appears in the above-identified patent and that said Letters Patent is hereby corrected as shown below:

In the Claims

Column 12, Line 45 (Claim 1, Line 19), please change "pad" to -- pad, --.

Signed and Sealed this
Nineteenth Day of October, 2021

Drew Hirshfeld
*Performing the Functions and Duties of the*
*Under Secretary of Commerce for Intellectual Property and*
*Director of the United States Patent and Trademark Office*